United States Patent [19]

Itaya et al.

[11] Patent Number: 4,812,738
[45] Date of Patent: Mar. 14, 1989

[54] APPARATUS FOR ANALYZING TRANSMISSION/REFLECTION CHARACTERISTICS

[75] Inventors: Hiroshi Itaya, Isehara; Goro Saito, Aikawamachi, both of Japan

[73] Assignee: Anritsu Corporation, Tokyo, Japan

[21] Appl. No.: 945,873
[22] PCT Filed: Apr. 11, 1986
[86] PCT No.: PCT/JP86/00180
§ 371 Date: Dec. 1, 1986
§ 102(e) Date: Dec. 1, 1986
[87] PCT Pub. No.: WO86/06230
PCT Pub. Date: Oct. 23, 1986

[30] Foreign Application Priority Data

Apr. 13, 1985 [JP] Japan .................................. 60-78757

[51] Int. Cl.$^4$ ............................................. G01R 27/04
[52] U.S. Cl. ...................................... 324/58 B; 375/10
[58] Field of Search ............... 324/58 B; 375/3, 3.1, 375/10

[56] References Cited

U.S. PATENT DOCUMENTS 3,197,696  7/1965  Bibo .................................. 324/58 B
4,349,707  9/1982  Perrigault et al. ................... 379/24

FOREIGN PATENT DOCUMENTS 3040241  5/1981  Fed. Rep. of Germany .
2469054  10/1979  France .
53-16514  2/1978  Japan .
54-52409  4/1979  Japan .
56-75734  6/1981  Japan .
57-133733  8/1982  Japan .
60-8463  3/1985  Japan .
8005941  10/1980  Netherlands .
2063491  6/1981  United Kingdom .

OTHER PUBLICATIONS

Anritsu Catalog-Network/Spectrum Analyzer-Model MS620J, Dec. 1985.

Primary Examiner—A. D. Pellinen
Assistant Examiner—Morris Ginsburg
Attorney, Agent, or Firm—Frishauf, Holtz, Goodman & Woodward

[57] ABSTRACT

Measuring signals whose frequencies stepwise vary with time are fed to a test port of a reflection signal separator through an input port. A through transmission path and short- and open-circuiting elements are selectively connected to the test port. The reflection signal separator has an output port to allow a reflection signal from the test port and transmission signal passed via the through transmission path to be stored in first to third memory circuits through first and second heterodyne receivers equipped with a level correction function. A calculation circuit allows output signals of the first and second heterodyne receivers when an object to be measured is connected to the test port to be calibrated with the use of memory contents of first, second and third memory means so that the output signals are displayed on a display device.

4 Claims, 7 Drawing Sheets

APPLIED VOLTAGE
(FROM TRACKING
CKT 36-7)

FIG. 12

VOLTAGE APPLIED
TO VARIABLE
CAPACITANCE DIODE

FIG. 13

APPARATUS FOR ANALYZING TRANSMISSION/REFLECTION CHARACTERISTICS

TECHNICAL FIELD

This invention relates to an apparatus for analyzing transmission/reflection characteristics, which can measure both transmission/reflection characteristics with the use of a 2-channel heterodyne type level measuring device.

BACKGROUND ART

Figure 1:
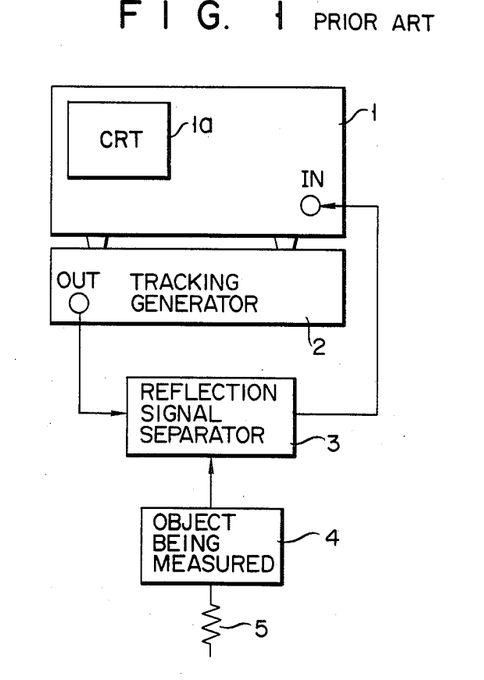
FIG. 1 is a block diagram showing one form of a conventional apparatus for measuring a reflection characteristic.

FIG. 1 is a block diagram showing a conventional reflection characteristic measuring apparatus with the use of a spectrum analyzer. Upon the receipt of an output signal from a tracking generator 2 of synchronous transmitter type, reflection signal separator 3 allows a reflection signal from a to-be-measured object, e.g.) circuit network 4 to be supplied to spectrum analyzer 1 which is comprised of a 1-channel heterodyne receiver. Reflection signal separator 3 is called an impedance bridge.

As shown in FIG. 1, the output signal of tracking generator 2 is coupled to reflection signal separator 3, and circuit network 4 is connected to a measuring terminal side of reflection signal separator 3 so that a reflection signal from circuit network 4 is separated by separator 3 and supplied to an input terminal of spectrum analyzer 1. In this way, it is possible to measure the reflection characteristic. Here it is to be noted that circuit network 4 terminates in reflectionless terminating device 5.

Figure 2:
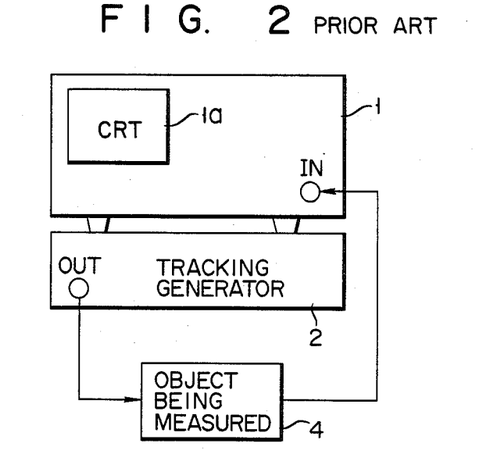
FIG. 2 is a block diagram showing one form of a conventional apparatus for measuring a transmission characteristic.

FIG. 2 is a block diagram for measuring the transmission characteristic of circuit network 4. This measuring circuit is comprised of tracking generator 2 and circuit network 4 to measure the transmission characteristic in circuit network 4.

In the method for measuring the aforementioned transmission/reflection characteristics using the spectrum analyzer as shown in FIGS. 1 and 2, the transmission and reflection characteristics cannot simultaneously be measured due to only one channel being present at the input of the spectrum analyzer. Furthermore, if a measuring signal is switched by a switching device to measure both the transmission and reflection signals, then no exact result of measurement can be obtained due to a variation in the reproducibility of the switching device and in the condition of matching.

DISCLOSURE OF INVENTION

It is accordingly the object of this invention to provide an apparatus for analyzing transmission/reflection characteristics, which can simultaneously measure both transmission and reflection characteristics without switching of connections.

In order to attain the aforementioned object an apparatus is provided which analyzes transmission/reflection characteristics. This apparatus comprises:

a signal generator for measurement which generates a measuring signal whose frequencies sequentially varies with time;

a reflection signal separator having an input port supplied with the measuring signal, a test port and an output port;

a through transmission path and short- and open-circuiting elements selectively connected to the test port;

a first heterodyne receiver having a receiving terminal connected to the output port;

a second heterodyne receiver having a receiving terminal connected to the through transmission path;

a first memory circuit for storing an output signal of the second heterodyne receiver in association with the frequency of the measuring signal when the second heterodyne receiver is connected to the test port via the through transmission path;

a second memory circuit for storing the output signal of the first heterodyne receiver in association with the frequency of the measuring signal when the short-circuiting element is connected to the test port;

a third memory circuit for storing the output signal of the first heterodyne receiver when the open-circuiting element is connected to the test port;

an arithmetic operation device for calibrating the output signals of the first and second heterodyne receivers with the use of memory contents of the first to third memory circuits when an object to be measured is connected between the output port and the second heterodyne receiver; and a device for allowing the output signals of the first and second heterodyne receivers which have been calibrated by the arithmetic operation device to be displayed in association with the frequency of the measuring signal.

BEST MODE OF CARRYING OUT THE INVENTION

Figure 3:
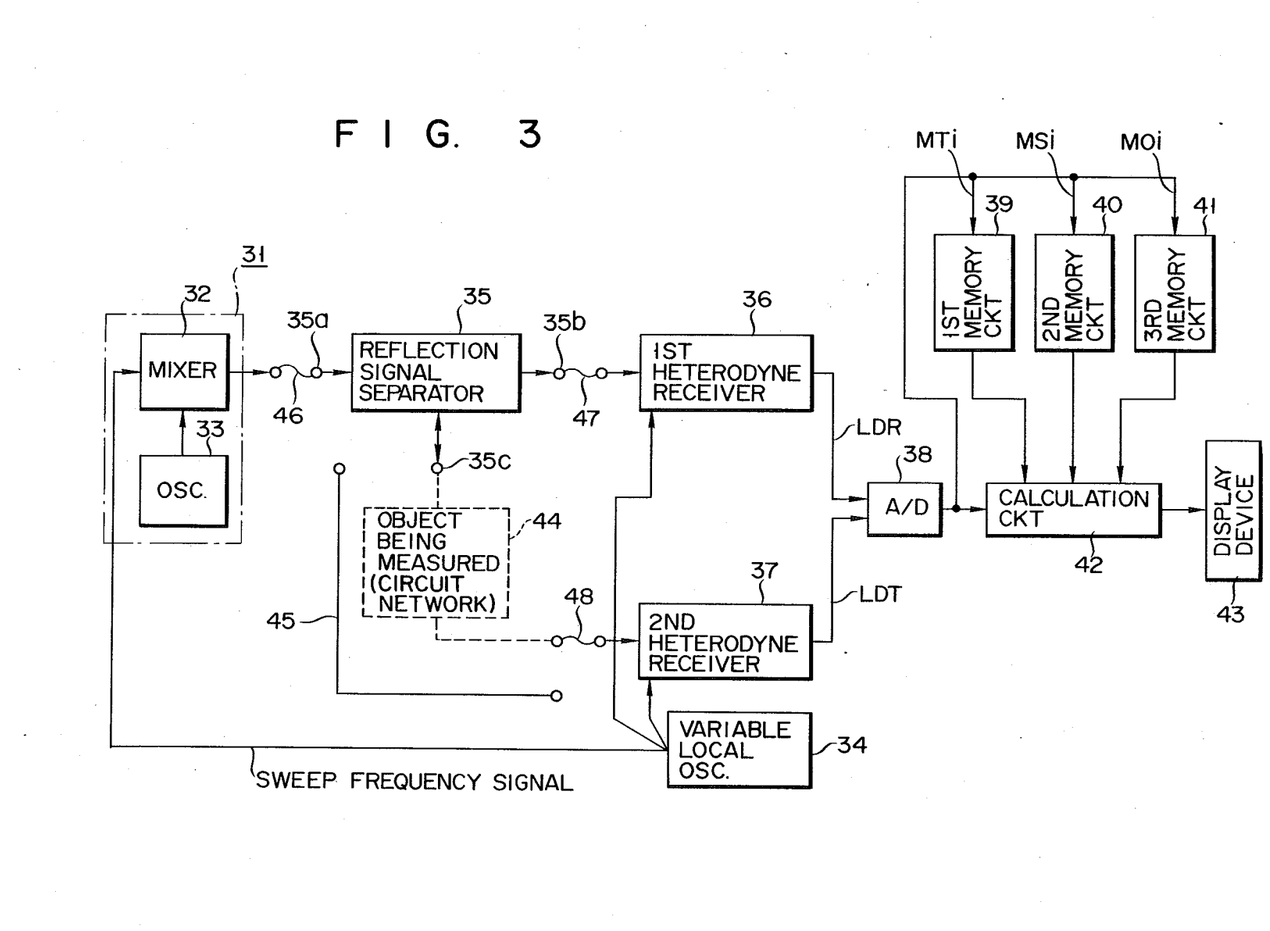
FIG. 3 is a block diagram showing an analyzing apparatus connected with an object being measured, according to one embodiment of this invention.

As appreciated from FIG. 3, an apparatus for analyzing transmission/reflection characteristics, i.e., one embodiment of this invention, includes signal generator 31 having mixer 32 and oscillator 33; variable local oscillator 34; reflection signal separator 35; input port 35a; output port 35b; test port 35c; first heterodyne receiver 36; second heterodyne receiver 37; analog/digital (A/D) converter section 38; first memory circuit 39; second memory circuit 40; third memory circuit 41; arithmetic operation or calculation circuit 42; display device 43; and cables 46, 47 and 48.

Signal generator 31 is a transmitter for generating frequency signals which vary with time. Signal generator 31 is comprised of mixer 32 and oscillator 33. Output signals from the variable local oscillator 34 are supplied to first and second heterodyne receivers 36 and 37 as will be set forth below. A sweep frequency signal of variable local oscillator 34 is supplied to mixer 32. It is to be noted that two mutually synchronizing oscillators may be provided with respect to receivers 36 and 37 in place of variable local oscillator 34.

Reflection signal separator 35 is comprised of a three-terminal directional coupler having input port 35a, output port 35b and test port 35c. Input port 35a is connected to the transmitting terminal of signal generator 31, output port 35b is connected to the input terminal of first heterodyne receiver 36, and test port 35c is coupled at the time of measurement to a circuit network 44 (hereinafter referred to as "a to-be-measured object 44" or "object being measured 44") and at the time of calibration to "through" transmission path 45, to short-circuiting element 52 or to open-circuiting element 53.

First and second heterodyne receivers 36 and 37 are each comprised of a level measuring device having, preferably, a level correction function, and are used as, for example, a 2-channel spectrum analyzer or 2-channel network/spectrum analyzer. The level correction function will be explained below in more detail with reference to FIGS. 10 to 13.

First memory circuit 39 is of such a type as to store an output signal $M_T$ of second heterodyne receiver 37 when a signal of varying frequency is applied from signal generator 31 to reflection signal separator 35, provided that "through" transmission path 45 is connected at the time of calibration to test port 35c of reflection signal separator 35.

Second memory-circuit 40 is of such a type as to store an output signal $M_S$ of first heterodyne receiver 36 when a signal of varying frequency is supplied to reflection signal separator 35, provided that short-circuiting element 52, such as a short-circuiting connector, is connected at the time of calibration to test port 35c of reflection signal separator 35.

Third memory circuit 41 is of such a type as to store an output signal $M_O$ of first heterodyne receiver 36 when a signal of varying frequency is supplied from signal generator 31 to reflection signal separator 35, provided that open-circuiting element 53, such as an open-circuiting connector, is connected at the time of calibration to test port 35c of reflection signal separator 35. Calculation circuit 42 is comprised of, for example, a CPU and is of such a type that, when at the time of measurement a signal of varying frequency is supplied from signal generator 31 to reflection signal separator 35 under the condition that the to-be-measured object (44) is connected to test port 35c of reflection signal separator 35, circuit 42 performs the following operational formulas (1) and (2), while using the aforementioned signal for address signal generation, from output signal $L_{DR}$ of first heterodyne receiver 36 and output signal $L_{DT}$ of second heterodyne receiver 37:

$$\left( L_{DRi} - \frac{M_{Si} + M_{Oi}}{2} \right) \quad (1)$$

$$(L_{DTi} - M_{Ti}) \quad (2)$$

where $L_{DRi}$ and $L_{DTi}$ denote digital signals which are output from first and second heterodyne receivers 36 and 37, respectively, when a signal of i-th frequency is applied from the signal generator, provided that the to-be measured object is connected to reflection signal separator 35. $M_{Ti}$, $M_{Si}$ and $M_{Oi}$ show digitized signals of the i-th frequency which are output from firs and second heterodyne receivers 36 and 37 in accordance with address signals read out of first, second and third memory circuits 39, 40 and 41, respectively.

Display device 43 is, for example, of a CRT type having the function of simultaneously displaying tracing patterns on at least two-channels. Display device 43 permits the simultaneous display of transmission/reflection characteristics calculated by calculation circuit 42.

An explanation will be given below of calibration signals to be initially stored, under the control of circuit 42, in first to third memory circuits 39 to 41.

Figure 4:
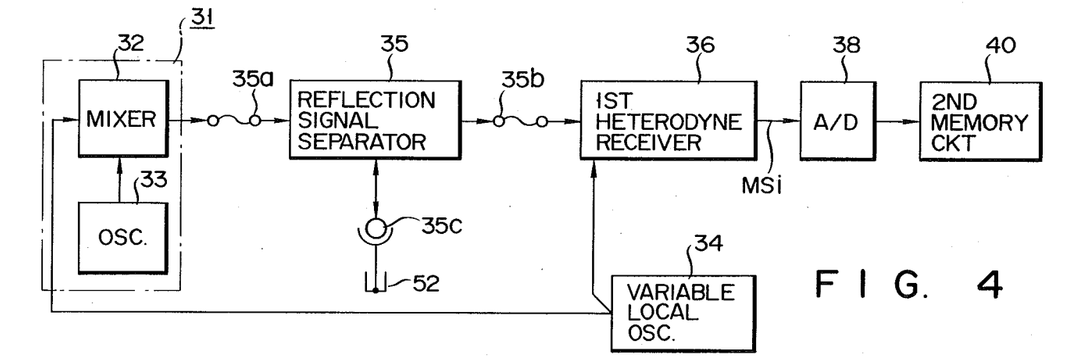
FIGS. 4 to 7 are block diagrams for explaining the operation of the embodiment of FIG. 3.

FIG. 4 is an explanatory view for explaining, for example, a short-circuiting calibration on the side of the first heterodyne receiver. Short-circuiting element 52 is manually connected to test port 35c of reflection signal separator 35.

A signal which is input from signal generator 31 to reflection signal separator 35 advances from input port 35a toward test port 35c and, when reflected by short-circuiting element 52, advances toward output port 35b and is input to first heterodyne receiver 36. The level of an output signal emerging from first heterodyne receiver 36 is digitized by analog/digital converter section 38 and stored in second memory circuit 40.

Now suppose that, for example, 1001 horizontal pixels are provided on display device 43 and that signals of 1001 frequencies are output from signal generator 31 to reflection signal separator 35. When, in this case, a signal of an i-th frequency $f_i$ is input from signal generator 31 to reflection signal separator 35 as shown in FIG. 4, a signal output level $M_{Si}$ of first heterodyne receiver 36 which has been digitized through analog-digital converter section 38 is stored at address i in second memory circuit 40. When signal generator 31 completes one sweep, the output levels of first heterodyne receiver 36 corresponding to the respective 0-th to 1000-th (1001)frequencies of the signal emerging from signal generator 31 are stored at the respective addresses in second memory circuit 40.

Figure 5:
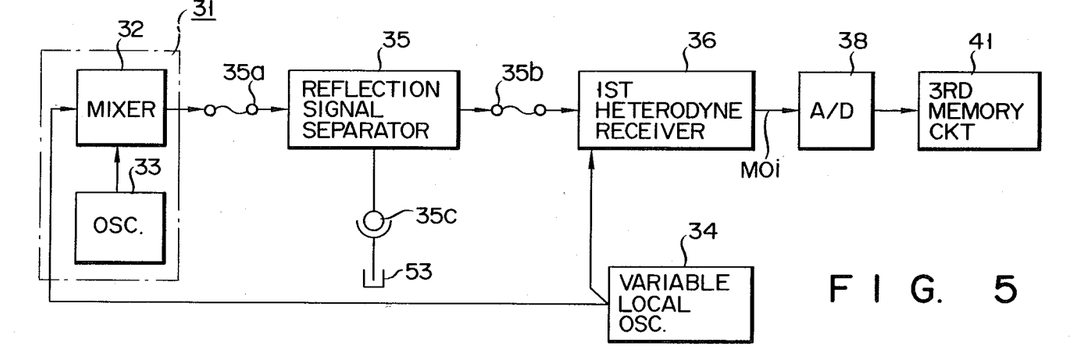

FIG. 5 is an explanatory view for showing, for example, an open-circuiting calibration on the side of the first heterodyne receiver. Open-circuiting element 53 is manually connected to test port 35C of reflection signal separator 35.

As in the case of the arrangement shown in FIG. 4, when signal generator 31 completes one sweep, the output levels $L_{oi}$ of first heterodyne receiver 36 corresponding to the respective 0-th to 1000-th frequencies of the signal emerging from signal generator 31 are stored at the corresponding addresses i in third memory circuit 41 under the control of calculation circuit 42.

Figure 6:
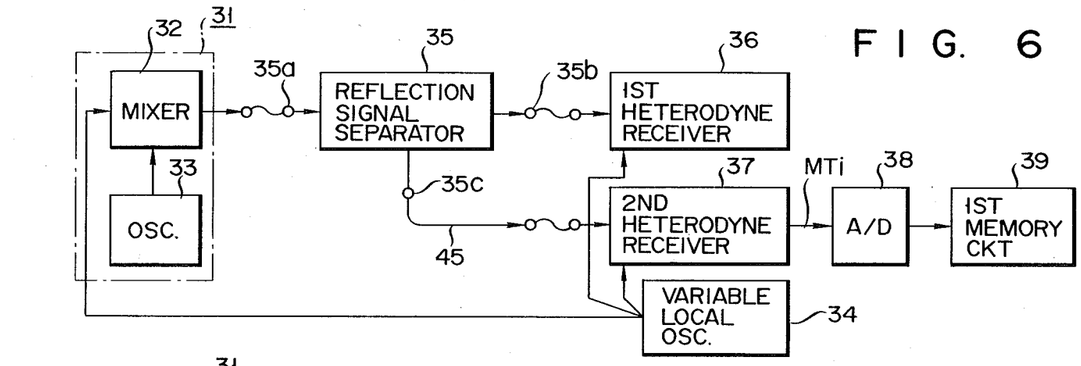

FIG. 6 is an explanatory view for showing a calibration process on the side of second heterodyne receiver 37. In the arrangement shown in FIG. 6, "through" transmission path 45 is connected to test port 35c and output port 35b of reflection signal separator 35 is connected via the cable to first heterodyne receiver 36.

Like the case of FIG. 4, when signal generator 31 completes one sweep, the output levels $M_{Ti}$ of second heterodyne receiver 37 corresponding to the 0-th to 1000-th frequencies of the signal emerging from signal generator 31 are stored at the corresponding addresses i in first memory circuit 39.

Prior to the measurement of the to-be-measured object 44, calibration signal data are initially stored in first to third memory circuits 39 to 41, respectively.

Figure 7:
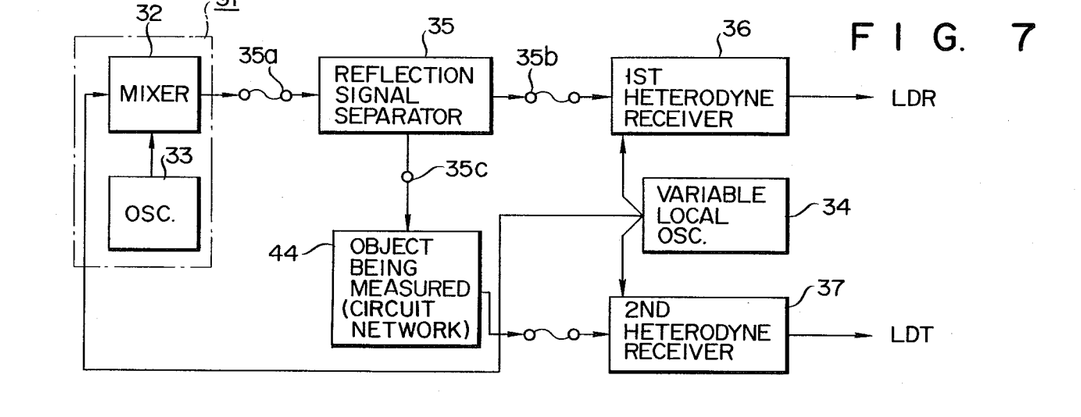

FIG. 7 is an explanatory view showing a detail of a connection involved upon the measurement of to-be-measured object 44 which is connected between test port 35c of reflection signal separator 35 and the input terminal of second heterodyne receiver 37.

As shown in FIGS. 6 and 7, a signal swept through 0-th to 1000-th frequencies input from signal generator 31 to reflection signal separator 35. Now suppose that a signal from signal generator 31 to reflection signal separator 35 corresponds to the i-th frequency $f_i$. At this time, a signal of a frequency $(f_0+f_i)$ as a sum of the i-th frequency $f_i$ from signal generator 31 to reflection signal separator 35 and intermediate frequency $f_0$ of first and second heterodyne receivers 36 and 37 is supplied to first and second heterodyne receivers 36 and 37 from variable local oscillator 34. With the output levels of first and second heterodyne receivers 36 and 37 as $L_{DRi}$ and $L_{DTi}$, respectively, these output levels $L_{DRi}$ and $L_{DTi}$ are digitized by analog/digital converter 38 and input to calculation circuit 42.

Calibration values MTi, MSi and MOi corresponding to the i-th frequency $f_i$ of an input signal from signal generator 31 to reflection signal separator 35 are read from first to third memory circuits 39 to 41 into calculation circuit 42. Formulas (1) and (2) are calculated from the output levels $L_{DRi}$ and $L_{DTi}$ and calibration values $M_{Ti}$, $M_{Si}$ and $M_{Oi}$ by virtue of calculation circuit 42. A result of calculation is sent to display device 43 where it is displayed as a dot on the i-th pixel position in the horizontal direction of display device 43. A swept signal of the 0-th to 1000-th frequencies is input from signal generator 31 to reflection signal separator 35 to allow two lines to be traced simultaneously.

Figure 8:
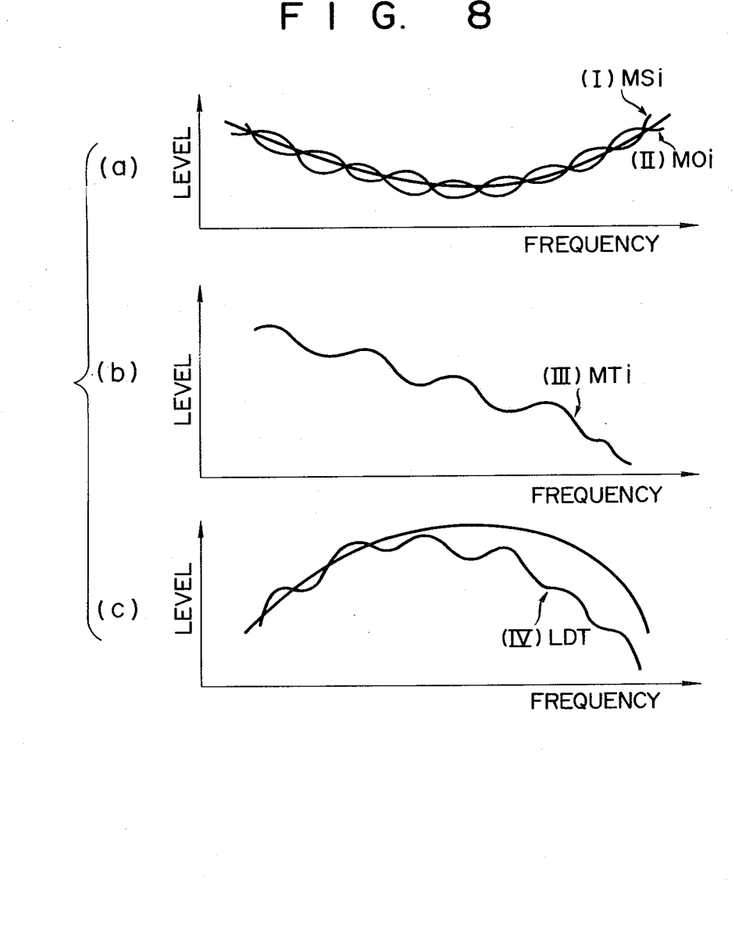
FIG. 8 shows a signal waveform diagram for explaining the operation of this embodiment.
Figure 9:
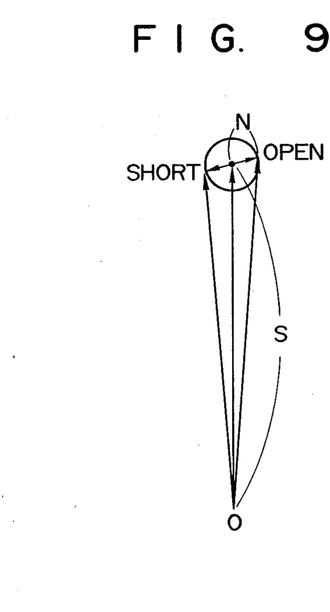
FIG. 9 is a view for explaining the operation of a calibration.

FIG. 8 is a waveform diagram for explaining a normalizing function, in which curves I and II show the normalizing patterns on the side of the first heterodyne receiver. The output level wavers, as shown in curves III and IV in FIG. 8, due to, for example, the cable characteristic between the transmitting terminal of signal generator 31 and input port 35a of reflection signal separator 35, cable characteristic between output port 35b of reflection signal separator 35, the input terminal of first heterodyne receiver 36, internal frequency characteristic of reflection signal separator 35, cable characteristic between test port 35c of reflection signal separator 35 and the input terminal of second heterodyne receiver 37, and frequency charcteristic (Long-Line Effect) on the cable whereby the pitch of a signal ripply over the length of the cable varies due to a mismatching among the respective terminals. A 180° phase shift occurs, as indicated by curves (I) and (II) in FIG. 8, between a short-circuiting calibration value $M_{Si}$ on the side of first heterodyne receiver 36 which is stored in second memory circuit 40, and an open-circuiting calibration value $M_{Oi}$ on the side of first heterodyne receiver 36 which is stored in third memory circuit 41. After the short-circuiting calibration value $M_{SI}$ and open-circuiting calibration value $M_{Oi}$ have been converted from the db value to a linear value, an arithmetic mean of these calibration values is taken as shown in formula (1), and a normalization process is performed by subtracting the means value from LDRi, so that the exactness of the value of formula (1) is enhanced. If the degree of matching of test port 35c of reflection signal separator 35 is better, i.e., the S/N ratio is large enough, an arithmetic mean can be taken, as evident from FIG. 9, in the db format. In FIG. 9, S denotes a signal component and N denotes a noise component resulting from the degree of matching of test port 35c.

In FIG. 8, the curves III and IV are indicated by $M_{Ti}$ and LDT, respectively. If subtraction is made as indicated by formula (2), then the aforementioned wavering is eliminated and thus the normalization is achieved. As a result, the exactness of the value in formula (2) is enhanced.

The output levels of first and second heterodyne receivers 36 and 37 are, in general, in log representation. Formulas (1) and (2) are, when converted from the log to the linear value, calculated in floating point arithmetic and, for log values involved, in fixed point arithmetic by virtue of calculation circuit 42.

Figure 13:
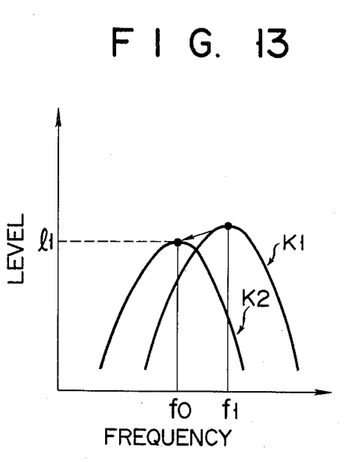
FIG. 13 is a graph for explaining the operation of the circuit of FIG. 11.

The level correction function of first and second heterodyne receivers 36 and 37 will be explained below with the use of FIGS. 10 and 13.

Figure 10:
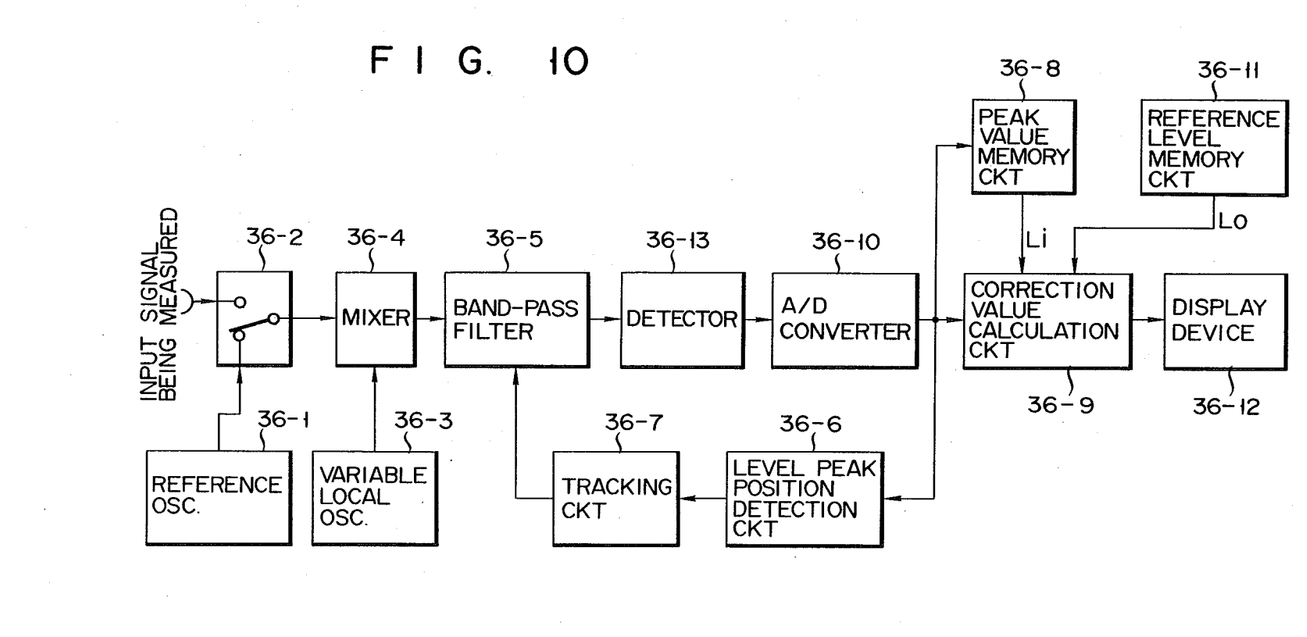
FIG. 10 is a block diagram showing one form of a heterodyne receiver in the embodiment of this invention which has a level correction function.

FIG. 10 is an explanatory view for one-channel, that is, the level correction of first heterodyne receiver 36, for example, in the embodiment of FIG. 3.

FIG. 10 shows one form of heterodyne receiver including reference oscillator 36-1, input switching device 36-2, variable local oscillator 36-3, mixer 36-4, bandpass filter 36-5, level peak position detector 36-6, tracking circuit 36-7, peak value memory circuit 36-8, correction value calculation circuit 36-9, analog/digital converter section 36-10, reference leveel memory circuit 36-11, display device 36-12 and detector 36-13.

As variable local oscillator 36-3 use is made of a type having a high frequency resolution, such as a synthesizing type. Reference oscillator 36-1 is coupled to variable local oscillator 36-3 in a phase-synchronizing relation and is of such a type as to stabilize their frequency and level. An output level $l_0$ of oscillator 36-1 is initially stored in reference level memory circuit 36-11.

Figure 11:
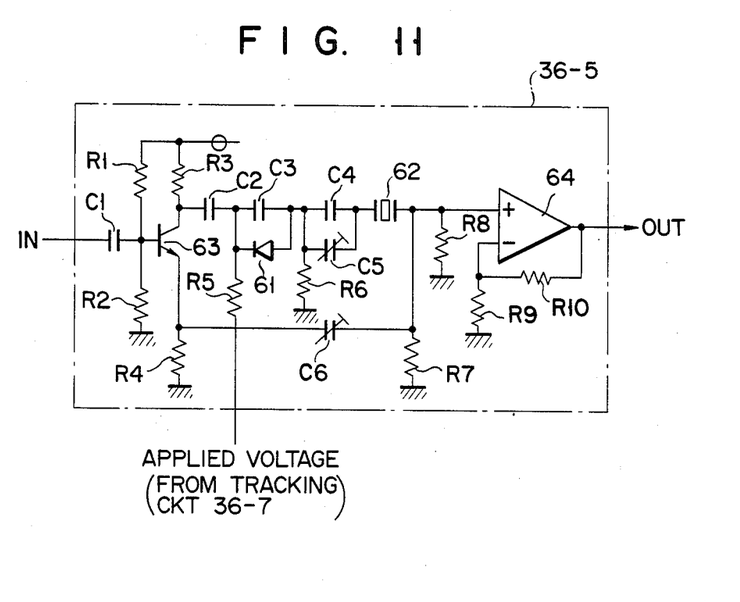
FIG. 11 shows a practical circuit of a bandpass filter in FIG. 10.

Bandpass filter 36-5 is of a resolution bandwidth (RBW) type having, for example, variable capacity diode 61 as one of its component parts as shown in FIG. 11. The peak position of a tuning frequency of the filter varies depending upon a voltage applied to variable capacity diode 61. In FIG. 11, reference numeral 62 shows a crystal filter. An output signal of mixer 36-4 is supplied to an input IN of bandpass filter 36-5. The input signal is supplied to the base of transsistor 63 via capacitor C1. Resistors R1 and R2 are serially connected to supply a bias voltage to the base of transistor 63 which acts as an inversion buffer circuit together with resistors R3 and R4. Thus, the input signal is inverted at the collector of transistor 63 while a non-inverted output is obtained at the emitter. The non-inverted signal obtained at the emitter of transistor 63 is supplied to a high-pass filter circuit of capacitor C6 and resistor R7. The output signal of the high-pass filter is supplied to a non-inverting input terminal of output buffer circuit 64.

The inverted input signal obtaained at the collector of transistor 63 is supplied to a band-pass circuit of capacitors C2, C3, C4, C5, variable capacitance diode 61, crystal filter 62 and resistors R5 and R6. The band-passed signal is supplied to the non-inverting terminal of output buffer 64 which includes resistors R8 to R10. The band-passed signal and high-passed signal are combined at the output of buffer 64, and a desired band-passed signal is obtained at an output terminal OUT of the bandpass filter 36-5.

Tracking circuit 36-7 serves to allow the tuning frequency, with which the output level of bandpass filter 36-5 becomes a peak, to concide with an intermediate frequency $f_0$ of mixer 36-4. As set forth above, a voltage applied to variable capacity diode 61 is supplied as a means for making that frequency coincide with the intermediate frequency $f_0$.

Level peak position detector 36-6 detects the position of a sweeping frequeny with which the maximum of peak levels is output from bandpass filter 36-5 when the sweep frequency of variable local oscillator 36-3 minutely varies, for mixing, with respect to the reference level and reference frequency of reference oscillator 36-1. The position of the aforementioned sweep frequency is detected by making a comparison between the output of bandpass filter 36-5, i.e., the output $M_0$ of analog/digital converter section 36-10, when a center frequency $f_c$ is set to variable local oscillator 36-3 and the output of the bandpass filter 36-5, i.e., the output $M_1$ of analog/digital converter section 36, when the sweep frequency of variable local oscillator 36-3 is set to a frequency which is greater (or smaller) than the center frequency $f_c$ by one step. It is found that if, at this time, $M_1 - M_0 > 0$, the maximum level is present on the side of a frequency greater (or smaller) than the center frequency $f_c$ by one step. Thus the sweep frequency of local oscillator 36-3 is set to a frequency greater (or smaller) than the center frequency $f_c$ by two steps. It has been found that, when at $$M_{i+1} - M_i < 0 (i = 1, 2, 3, \ldots)$$

the sweep frequency is involved at one previous step, then the output level of bandpass filter 36-5 becomes maximal. This is self-evident from the fact that crystal filter 62 in bandpass filter 36-5 is unimodal in nature. The position of the aforementioned sweep frequency with which the output leve of bandpass filter 36-5 becomes maximal can be detected by level peak position detector 36-6.

Figure 12:
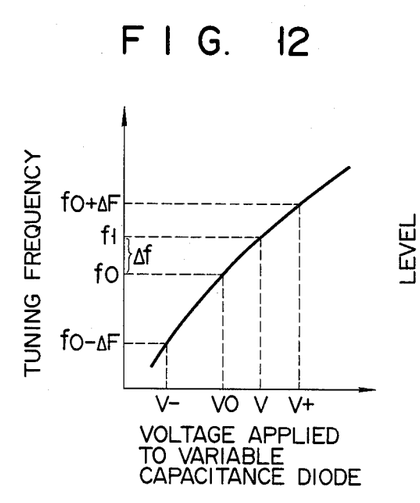
FIG. 12 is a graph showing the operation of a variable capacitance diode in FIG. 11.

Let it be assumed that the frequency with which the output level of bandpass filter 36-5 becomes maximal is deviated from intermediate frequency $f_0$ by $\Delta f$ due to a change in ambient temperature as well as aging to cause the frequency $f_0$ to occur. Inorder to eliminate the deviation $\Delta f$ of the frequency, a variable capacitance diode application voltage/frequency tuning curve as shown in FIG. 12 is found for bandpass filter 36-5 and the variable capacitance diode application voltage $V_0$ is found, for band-pass filter 36-5, from the curve so found. The variable capacitance diode appliation voltage $V_0$ is found from tracking circuit 36-7 of a ROM table type and then it is applied to variable capacitance diode 61 in band-pass filter 36-5. By so doing, the tuned frequency with which the output level of bandpass filter 36-5 becomes maximal becomes $f_0$ in the curve $K_2$ shown in FIG. 13. That is, the curve $K_1$ as shown in FIG. 13 is moved to the curve $K_2$ in FIG. 13 so that the tuned frequency of bandpass filter 36-5 coincides with the intermediate frequency $f_0$ from mixer 36-4. At this time, the output level of bandpass filter 36-5 and thus the level $l_1$, which has been detected by detector 36-13 and digitized by analog/digital converter section 36-10, is stored in peak value memory circuit 36-8.

Then, input switching device 36-2 is switched to the side of an input signal to be measured to determine that input signal. From the above explanation it is evident that, at the time of measuring the input signal, the tuned frequency of bandpass filter 36-5 coincides with, and thus is tuned to, the intermediate frequency $f_0$ from mixer 36-4. The output level $l_M$ emerging from analog/digital converter section 36-10 at the time of measuring that input signal is input to correction value calculation circuit 36-9. Correction value calculation circuit 36-9 is, for example, of a CPU type which reads the levels $l_1$ and $l_0$ out of peak value memory circuit 36-8 and reference level memory circuit 36-11, respectively, and executes a correction value calculation of $l_M - (l_1 - l_0)$. The level $$l_M - (l_1 - l_0)$$

so calculated through correction value calculation circuit 36-9 is supplied to display device 36-12 where it is displayed at, for example a CRT. Since at this time, as set ot above, the tuned frequency of bandpass filter 36-5 coincides with the intermediate frequency $f_0$ from mixer 36-4, the deviation resulting from the detuning of bandpass filter 36-5 is completely corrected. The level $l_M - l_1$ reaches a value at which respective deviations over a range from input switching device 36-2 to analog/digital converter section 36-10 have relatively been corrected.

If the output level of reference oscillator 36-1 is set to be 0 dBm, then it is not necessary to provide reference level memory circuit 36-11.

According to this invention, as set out above, the aforementioned transmission/reflection characteristics can be measured, through the 2-channel level measuring device, without modifying the associated interconnection. Since, during measurement, neither the associated interconnection is altered nor the switching device is employed, no matching conditions vary, offering the better reproducibility of measured data. Furthermore, the reflection measuring channel, that is, the first heterodyne receiver side has the function of performing a normalization step on the basis of the short- and open-circuiting calibration darta and it is, therefore, possible to correct the transmission frequency characteristic and measuring end mismatching of the reflection signal separator, level frequency characteristic of the signal generator for measurement, loss frequency characteristic of the cable, and so on. On the other hand, the transmission measuring channel, that is, second heterodyne receiver can perform a normalizing function to correct the transmission frequency characteristic of the reflection signal separator, level frequency characteristic of the signal generator for measurement, loss frequency characteristic of the cable, and so on. It is, therefore, possible to obtain an exact result of measurement.

If the level measuring device is so configured as to permit the measurement level to be automatically corrected as required, then it is possible to obtain a measuring value of high accuracy.

If the bandwidth of the resolution bandwidth filter so calibrated varies so that the narrow band range may be employed, then it is possible to perform a stable measurement, with an improved S/N ratio, over a wider dynamic range.

We claim:

1. An apparatus for analyzing transmission/reflection characteristics of an object to be measured, comprising:
    means for generating a measuring signal whose frequency sequentially varies with time;

a reflection signal separator having an input port adapted to be supplied with the measuring signal, a test port and an output port;

a through transmission path and short-circuiting and open-circuiting elements arranged to be selectively connected to the test port;

a first heterodyne receiver having a receiving terminal connected to the output port;

a second heterodyne receiver having a receiving terminal arranged to be selectively connected either to the through transmission path or to the object to be measured;

means for enabling the receiving terminal of the second heterodyne receiver to be coupled to said test port via said through transmission path when in a calibration mode, and for enabling said receiving terminal of the second heterodyne receiver to be coupled to said test port via the object to be measured when in a measurement mode;

first memory means for storing, in said calibration mode, an output signal of the second heterodyne receiver in association with the frequency of the measuring signal when the second heterodyne receiver is connected to the test port via the through transmission path;

second memory means for storing, in said calibration mode, an output signal of the first heterodyne receiver in association with the frequency of the measuring signal when the short-circuiting element is connected to the test port;

third memory means for storing, in said calibration mode, an output signal of the first heterodyne receiver in association with the frequency of the measuring signal when the open-circuiting element is connected to the test port;

an arithmetic operation device which, when the object to be measured is connected between the test port and the receiving terminal of the second heterodyne receiver, calibrates output signals of both the first and the second heterodyne receivers in accordance with the memory contents of said first to third memory means when in the measurement mode; and means for allowing the output signals of said first and said second heterodyne receivers which have been calibrated by said arithmetic operation device to be displayed in association with the frequency of the measuring signal.

2. The apparatus according to claim 1, in which said reflection signal separator includes a directional coupler having first, second and third terminals associated with the input port, output port and test port, respectively.

3. The apparatus according to claim 1, in which said generating means includes means for generating a sweep frequency signal for varying the frequency of the measuring signal with time.

4. The apparatus according to claim 1, in which said first and said second heterodyne receivers each includes means for level correction.

* * * * *